United States Patent
An et al.

(10) Patent No.: US 10,781,128 B2
(45) Date of Patent: Sep. 22, 2020

(54) CURVED DISPLAY DEVICE AND MANUFACTURING METHOD THEREOF

(71) Applicants: HYUNDAI MOTOR COMPANY, Seoul (KR); KIA MOTORS CORPORATION, Seoul (KR)

(72) Inventors: Jongkyo An, Osan-si (KR); Nae Seung Kang, Siheung-si (KR); Yang Ho Ryu, Yongin-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/151,043

(22) Filed: Oct. 3, 2018

(65) Prior Publication Data
US 2019/0152831 A1    May 23, 2019

(30) Foreign Application Priority Data

Nov. 20, 2017    (KR) .......................... 10-2017-0154413

(51) Int. Cl.
*C03B 23/03* (2006.01)
*H05K 1/14* (2006.01)
(Continued)

(52) U.S. Cl.
CPC ...... *C03B 23/0307* (2013.01); *B29C 45/1418* (2013.01); *B29C 45/14336* (2013.01); (Continued)

(58) Field of Classification Search
CPC ............ C03B 23/0307; C03B 23/0302; C03B 23/0252; C03B 23/03; C03B 23/0357; (Continued)

(56) References Cited

U.S. PATENT DOCUMENTS

| 4,337,997 A | * | 7/1982 | Sadoune | ................. B32B 15/04 |
| | | | | 359/848 |
| 6,582,799 B1 | * | 6/2003 | Brown | .............. B32B 17/10036 |
| | | | | 296/190.1 |

(Continued)

FOREIGN PATENT DOCUMENTS

| CN | 101727249 B | 2/2012 |
| CN | 203644001 U | 6/2014 |

(Continued)

*Primary Examiner* — Christopher E Leiby
(74) *Attorney, Agent, or Firm* — Slater Matsil, LLP (57) ABSTRACT

A method of manufacturing the curved display device includes a process of manufacturing a cover glass assembly by attaching a transparent polymer film to the back surface of a thin film glass of a flat plate, a process of bending and inserting the cover glass assembly into a curved cavity of a mold and then molding an edge member so as to be integrated with an edge portion of the cover glass assembly to maintain the cover glass assembly in a bent state, and a process of attaching a flexible display panel to the back surface of the cover glass assembly in a curved state after molding the edge member. The curved display device includes a cover glass assembly, an edge member to maintain the cover glass assembly in a bent state, and a flexible display panel attached to the back surface of the cover glass assembly.

20 Claims, 11 Drawing Sheets

(51) Int. Cl.
  *B32B 37/10* (2006.01)
  *G06F 3/041* (2006.01)
  *H05K 1/02* (2006.01)
  *B29C 45/14* (2006.01)
  *B32B 17/06* (2006.01)
  *B32B 17/10* (2006.01)
  *B32B 38/18* (2006.01)

(52) U.S. Cl.
  CPC .. *B29C 45/14434* (2013.01); *B29C 45/14811* (2013.01); *B32B 17/06* (2013.01); *B32B 17/064* (2013.01); *B32B 17/10018* (2013.01); *B32B 17/10889* (2013.01); *B32B 37/10* (2013.01); *B32B 38/1866* (2013.01); *G06F 3/0412* (2013.01); *H05K 1/028* (2013.01); *H05K 1/147* (2013.01); *B32B 2333/12* (2013.01); *B32B 2369/00* (2013.01); *B32B 2457/20* (2013.01); *C03B 23/0302* (2013.01); *G06F 2203/04103* (2013.01)

(58) Field of Classification Search
  CPC . C03B 35/145; C03B 35/202; C03B 2225/02; H05K 1/147; H05K 1/028; B32B 37/10; B32B 17/06; B32B 38/1866; B32B 2457/20; G06F 3/0412; G06F 2203/04103; B29C 45/14; B60J 1/008
  See application file for complete search history.

(56) References Cited

U.S. PATENT DOCUMENTS

| | | | |
|---|---|---|---|
| 10,175,802 B2 * | 1/2019 | Boggs | G02F 1/13338 |
| 2010/0236290 A1 * | 9/2010 | Fukami | C03B 23/027 65/106 |
| 2012/0111479 A1 | 5/2012 | Sung et al. | |
| 2012/0202030 A1 * | 8/2012 | Kondo | C03C 8/24 428/215 |
| 2013/0340479 A1 * | 12/2013 | Balduin | C03B 23/0307 65/106 |
| 2014/0377508 A1 * | 12/2014 | Oh | B32B 37/10 428/174 |
| 2015/0153862 A1 * | 6/2015 | Nakamura | G06F 3/041 345/173 |
| 2016/0066412 A1 * | 3/2016 | Choi | G06F 1/1637 361/704 |
| 2016/0209926 A1 * | 7/2016 | Hashimoto | H04R 7/00 |
| 2016/0306451 A1 * | 10/2016 | Isoda | B32B 27/325 |
| 2017/0083128 A1 | 3/2017 | Lee et al. | |
| 2018/0150179 A1 * | 5/2018 | Moon | G06F 3/0418 |
| 2019/0179139 A1 * | 6/2019 | Oh | B29C 65/00 |
| 2019/0271876 A1 * | 9/2019 | Ogawa | B32B 37/003 |

FOREIGN PATENT DOCUMENTS

| | | |
|---|---|---|
| CN | 204463066 U | 7/2015 |
| JP | 2017-024386 A | 2/2017 |
| KR | 10-2009-0036501 A | 4/2009 |
| KR | 10-1486861 B1 | 1/2015 |
| KR | 10-2015-0019204 A | 2/2015 |
| KR | 10-2016-0111839 A | 9/2016 |
| WO | 2004/001661 A2 | 12/2003 |

* cited by examiner

CURVED DISPLAY DEVICE AND MANUFACTURING METHOD THEREOF

CROSS-REFERENCE TO RELATED APPLICATION

This application claims priority to and the benefit of Korean Patent Application No. 10-2017-0154413, filed on Nov. 20, 2017 in the Korean Intellectual Property Office, the disclosure of which is incorporated herein by reference in its entirety.

BACKGROUND

1. Technical Field

The present disclosure relates to a curved display device and a manufacturing method thereof.

2. Description of Related Art

A display device displays a variety of information on a screen so that people can view the information. Display devices are widely used in various industrial fields, such as automobiles, aircrafts, and medical devices, as well as in daily necessities such as PCs, mobile phones, and TVs.

Recently, display devices have been developed in various functions and forms, for example, by allowing a user to perform various functions by touching a screen with a finger or by implementing a screen with a curved surface.

The disclosure of this section is to provide background of the invention. Applicant notes that this section may contain information available before this application. However, by providing this section, Applicant does not admit that any information contained in this section constitutes prior art.

SUMMARY

A curved display device is complicated and difficult to manufacture as compared to a flat display device. In order to manufacture a curved display device, a cover glass assembly is manufactured through the processes of heating a flat glass to a high temperature to form a curvature, laminating a functional film and a film for controlling light on a curved glass, and separately manufacturing an edge member having a curvature and attaching it to an edge of the curved glass. Further, a flexible display panel that implements an image on the cover glass assembly is attached. A touch film may also be attached to the cover glass assembly to implement the touch function.

The curved display device is difficult to manufacture and has a very high manufacturing cost because it is subjected to challenging manufacturing processes such as molding a glass into a curved surface, attaching functional films to the curved glass, and manufacturing and attaching an edge member separately.

It is an aspect of the present disclosure to provide a curved display device and a manufacturing method thereof capable of simplifying the manufacturing process.

Additional aspects of the present disclosure will be set forth in part in the description which follows and, in part, will be obvious from the description, or may be learned by practice of the disclosure.

In accordance with one aspect of the present disclosure, there may be a curved display device including a cover glass assembly in which a transparent polymer film is laminated on the back surface of a thin film glass, an edge member to maintain the cover glass assembly in a bent state by being molded so as to be integrated with an edge portion of the cover glass assembly in a state in which the cover glass assembly is bent and inserted into a curved cavity of a mold, and a flexible display panel attached to the back surface of the cover glass assembly that maintains a curvature.

The cover glass assembly may include a light control film attached to the back surface of the transparent polymer film.

The transparent polymer film may be any one of a polycarbonate film, an acrylic film, and a laminate of a polycarbonate film and an acrylic film.

The curved display device may further include a touch film laminated between the back surface of the cover glass assembly that maintains a curvature and the flexible display panel.

In accordance with another aspect of the present disclosure, there may be a method of manufacturing a curved display device including a process of manufacturing a cover glass assembly by attaching a transparent polymer film to the back surface of a thin film glass of a flat plate, a process of bending and inserting the cover glass assembly into a curved cavity of a mold and then molding an edge member so as to be integrated with an edge portion of the cover glass assembly to maintain the cover glass assembly in a bent state, and a process of attaching a flexible display panel to the back surface of the cover glass assembly in a curved state after molding the edge member.

The process of manufacturing the cover glass assembly may include a process of attaching a light control film to the back surface of the transparent polymer film.

The method of manufacturing the curved display device may further include a process of attaching a touch film to the back surface of the cover glass assembly in a curved state before the process of attaching the flexible display panel.

The curved display devices and the manufacturing methods thereof according to certain embodiments of the present disclosure can further simplify the manufacturing processes compared to a conventional method of manufacturing a curved display device because the operation of attaching a transparent polymer film and a light control film to a thin film glass can be performed in a flat state and a cover glass assembly can be kept bent by inserting the cover glass assembly manufactured in a flat plate shape into a curved cavity of a mold in a bent state and then molding an edge member.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Hereinafter, embodiments of the present disclosure will be described in detail with reference to the accompanying drawings. The following embodiments are provided to fully convey the spirit of the present disclosure to a person having ordinary skill in the art to which the present disclosure belongs. The present disclosure is not limited to the embodiments shown herein but may be embodied in other forms. The drawings are not intended to limit the scope of the present disclosure in any way, and the size of components may be exaggerated for clarity of illustration.

An aspect of the present invention discloses a method for manufacturing a curved display device. The method includes attaching at least one transparent polymer film to a flat thin film glass to produce a layered glass module 110, inserting the thin glass module 110 into a curved cavity 30 of mold 10, 20. Subsequently, the glass module bends by pressure insides the mold as the upper mold 10 toward the lower mold 20. After the molds 10, 20 meet, at least part of cavity remains unfilled next to the bended glass module 110. Subsequently, a molten adhesive (resin) 120 is injected into the mold to fill the cavity 30 and to form edge frame 120 surrounding periphery of the glass module. The edge frame 120 contacts each layer of the glass module and maintains the glass module in a bended shape. After taking out the glass module 110 and frame 120 outside the mold, a flexible display device is attached to the glass module 110 to produce a curved display device.

Figure 1:
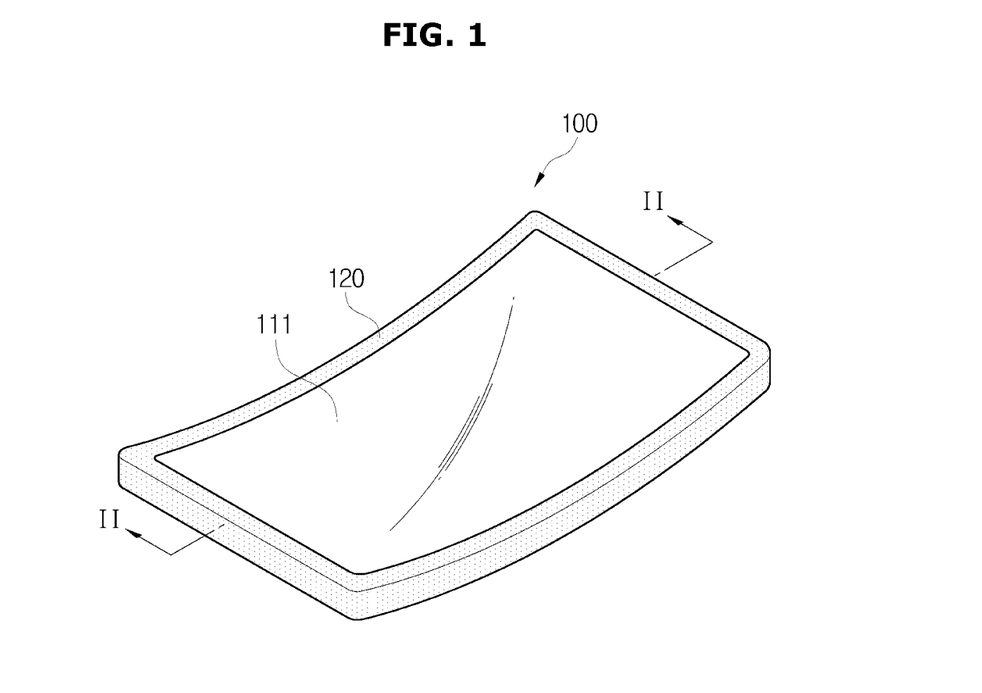
FIG. 1 is a perspective view of a curved display device according to a first embodiment of the present disclosure.
Figure 2:
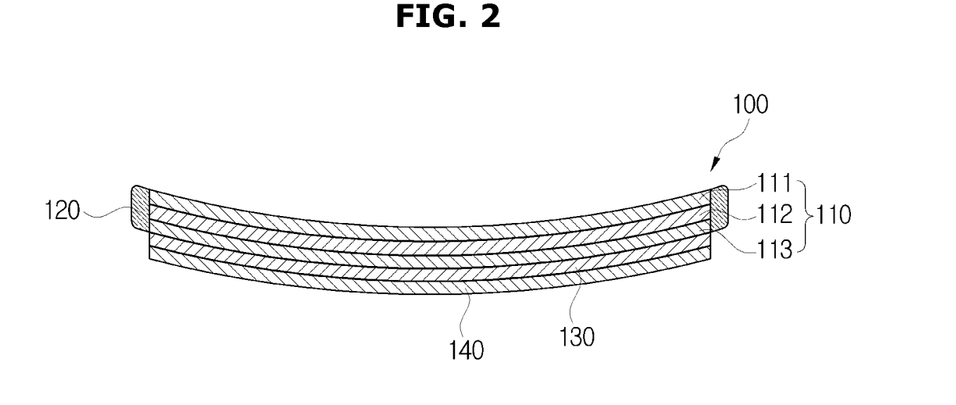
FIG. 2 is a cross-sectional view taken along line II-II in FIG. 1.

FIG. 1 is a perspective view of a curved display device according to a first embodiment of the present disclosure, and FIG. 2 is a cross-sectional view taken along line II-II in FIG. 1.

As shown in FIGS. 1 and 2, a curved display device 100 according to the first embodiment may include a thin film glass 111 having a curved front surface, a transparent polymer film 112 attached to the back surface of the thin film glass 111, a light control film 113 attached to the back surface of the transparent polymer film 112, a touch film 130 attached to the back surface of the light control film 113, a flexible display panel 140 attached to the back surface of the touch film 130, and an edge member 120 integrally joined to an edge portion.

Figure 3:
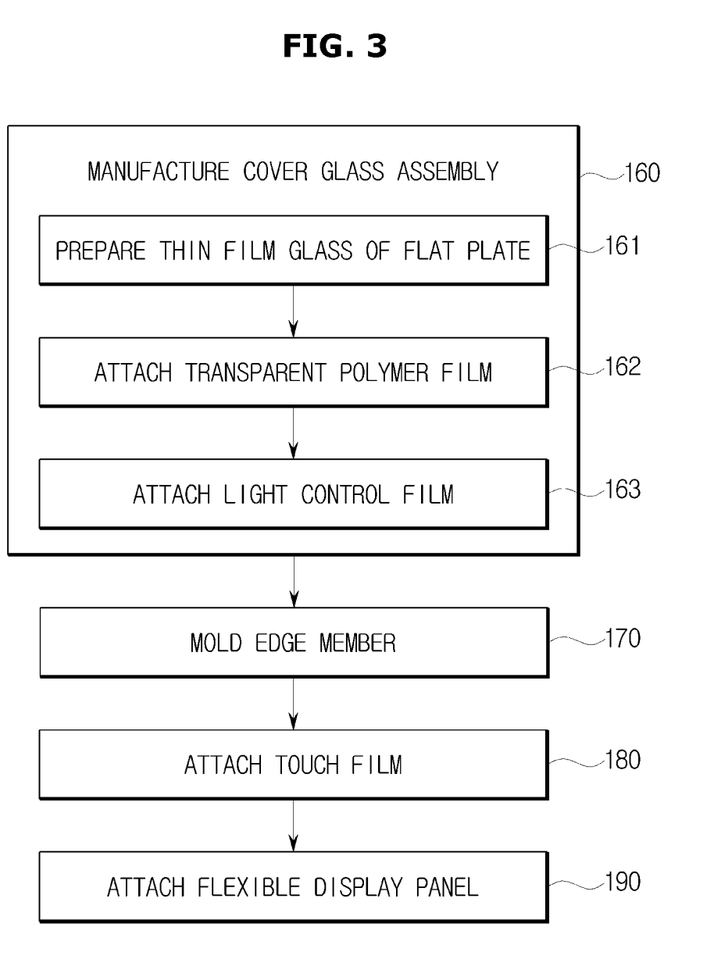
FIG. 3 illustrates processes of manufacturing the curved display device according to the first embodiment of the present disclosure.

As shown in FIG. 3, a method of manufacturing the curved display device 100 may include a process 160 of manufacturing a cover glass assembly 110 in which the thin film glass 111, the transparent polymer film 112, and the light control film 113 are sequentially laminated, a process 170 of molding the edge member 120 in a state in which the cover glass assembly 110 is bent, a process 180 of attaching the touch film 130 after molding the edge member 120, and a process 190 of attaching the flexible display panel 140 after attaching the touch film 130.

Figure 4:
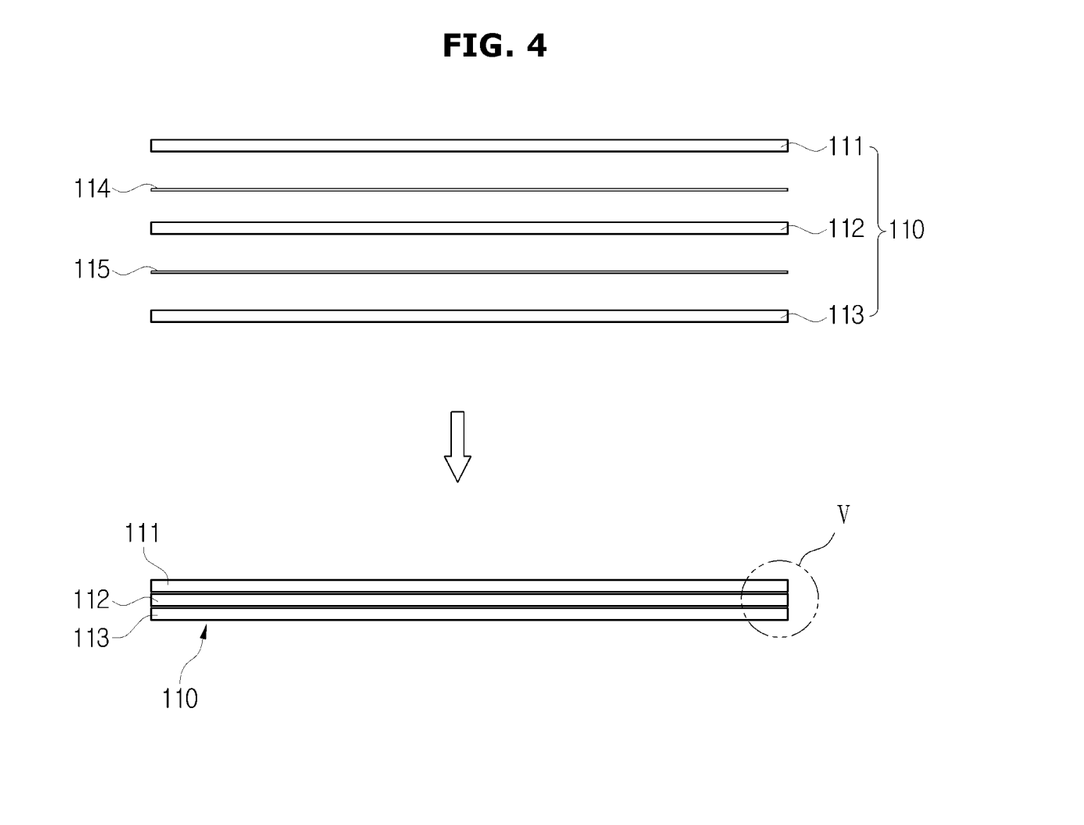
FIG. 4 illustrates a process of manufacturing a cover glass assembly of the curved display device according to the first embodiment of the present disclosure.

As shown in FIGS. 3 and 4, the process 160 of manufacturing the cover glass assembly 110 is performed by preparing the thin film glass 111 in the form of a flat plate, and then attaching the transparent polymer film 112 to the back surface of the prepared thin film glass 111 with an adhesive agent 114 interposed therebetween.

The transparent polymer film 112 may be bent at various curvatures, minimize the breakage of the thin film glass 111 during handling when attached to the back surface of the thin film glass 111, and prevent scattering even if the thin film glass 111 is broken. In addition, the transparent polymer film 112 maintains adhesion stably in a high-temperature and high-humidity environment, and functions to enhance adhesion to a material to be injected in the process of molding the edge member 120.

Figure 5:
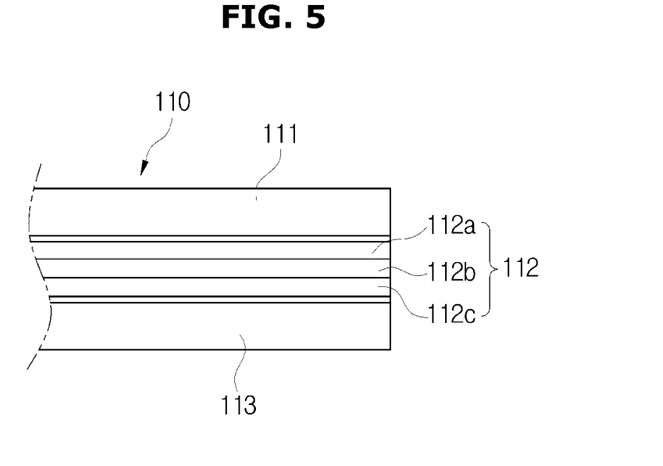
FIG. 5 is a detailed view of part V of FIG. 4.

The transparent polymer film 112 may be any one of a polycarbonate film, an acrylic film, and a laminate of a polycarbonate film and an acrylic film. Preferably, as shown in FIG. 5, the transparent polymer film 112 may be in the form of a polycarbonate film 112a, an acrylic film 112b, and a polycarbonate film 112c sequentially laminated.

After attaching the transparent polymer film 112 to the back surface of the thin film glass 111, the light control film 113 is attached to the back surface of the transparent polymer film 112 with an adhesive agent 115 interposed therebetween. The light control film 113 may prevent light from shining on the windshield of a vehicle or the like by adjusting the viewing angle when the curved display device 100 is mounted in the vehicle or the like. The light control film 113 may be bent at various curvatures as in the case of the transparent polymer film 112.

In embodiments, since the transparent polymer film 112 is attached to the back surface of the thin film glass 111 in a flat plate state and the light control film 113 is also attached to the back surface of the transparent polymer film 112 in a flat plate state, adhesion work of these films can be easily performed. Adhesion work of these films may be difficult when these films have to be adhered to a curved glass.

Figure 6A:
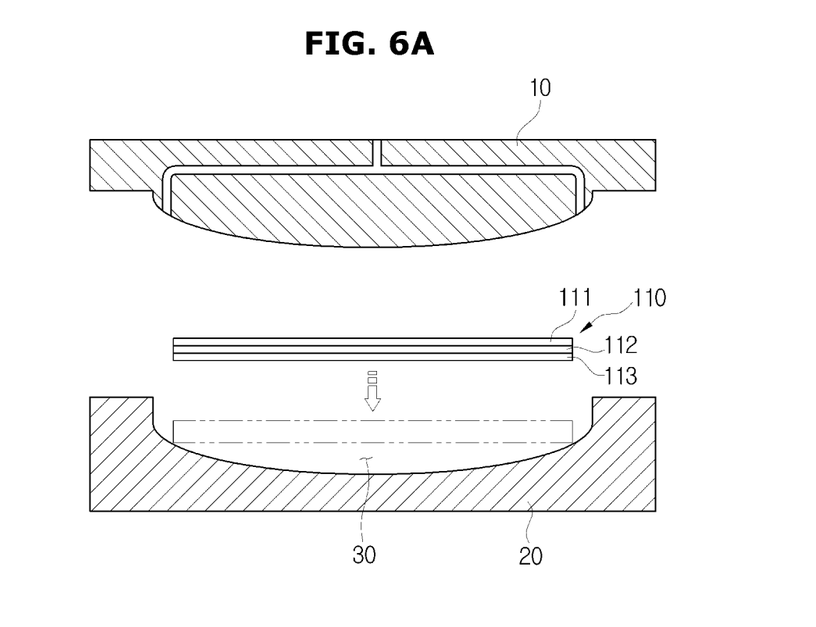
FIGS. 6A and 6B illustrate a process of molding an edge member of the curved display device according to the first embodiment of the present disclosure.
Figure 6B:
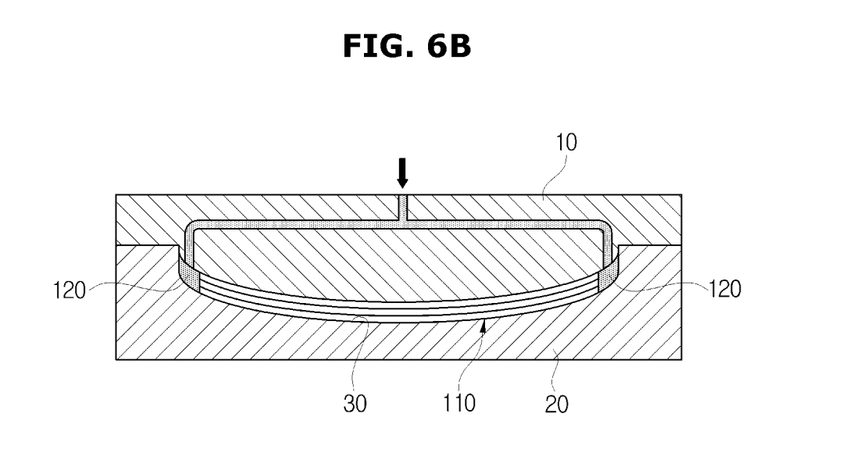

After manufacturing the cover glass assembly 110 by attaching the transparent polymer film 112 and the light control film 113, the edge member molding process 170 is performed. As shown in FIGS. 3 and 6, the edge member molding process 170 is performed by bending and inserting the cover glass assembly 110 into a curved surface cavity 30 between an upper mold 10 and a lower mold 20, and then by injecting an injection material outside the edge of the cover glass assembly 110 to mold the edge member 120.

In certain embodiments, a flat cover glass assembly 110 is placed over the lower mold 20 prior to a bending the assembly. Subsequently, as the upper mold 10 moves toward the lower mold 20, the flat over glass assembly 110 deforms inside the cavity 30 between the molds 10, 20. Subsequently, When the cover glass assembly 110 in a flat plate state as shown in FIG. 6A enters the curved surface cavity 30 of the lower mold 20 and then the upper mold 10 is closed, the cover glass assembly 110, as shown in FIG. 6B, is bent at a curvature corresponding to the inner surface of the curved surface cavity 30. In this state, when a molten injection material is injected into the space around the curved surface cavity 30 (periphery of the cover glass assembly), the edge member 120 is molded integrally with the periphery of the cover glass assembly 110. When the edge member 120 is molded as described above, the cover glass assembly 110 may maintain a bent state even if it is extracted from the mold, as shown in FIGS. 1 and 7.

Figure 7:
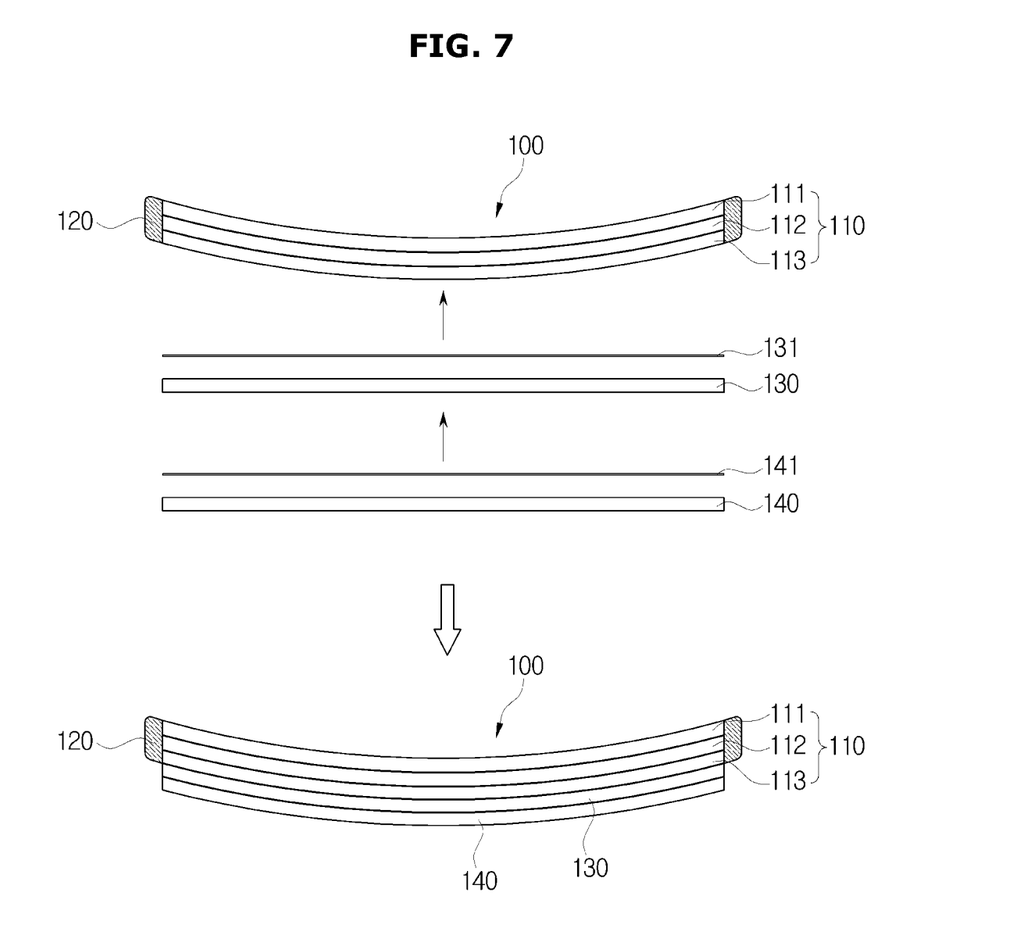
FIG. 7 illustrates a process of attaching a touch film and a process of attaching a flexible display panel in the curved display device according to the first embodiment of the present disclosure.

After molding the edge member 120, as shown in FIGS. 3 and 7, the process 180 of attaching the touch film 130 to the back surface (back surface of the light control film) of the cover glass assembly 110 in a curved state and the process 190 of attaching the flexible display panel 140 to the back surface of the touch film 130 are performed.

The touch film 130 may be attached to the back surface of the light control film 113 of the cover glass assembly 110 in a curved state through an adhesive agent 131, and the flexible display panel 140 may also be attached to the back surface of the touch film 130 in a curved state through an adhesive agent 141. The flexible display panel 140 may be an LCD (Liquid Crystal Display) panel or an OLED (Organic Light Emitting Diode) panel that is made bendable.

The method of manufacturing the curved display device 100 according to the first embodiment as described above can further simplify the manufacturing process because the operation of attaching the transparent polymer film 112 and the light control film 113 to the thin film glass 111 can be performed in a flat state and the cover glass assembly 110 can be kept bent by inserting the cover glass assembly 110 manufactured in a flat plate shape into the curved surface cavity 30 of the mold in a bent state and then molding the edge member 120.

A manufacturing a curved display device is complicated and difficult when it is necessary to apply a high heat to mold a glass into a curved surface, and to attach a transparent polymer film and a light control film to the curved glass. However, method of manufacturing the curved display device 100 according to embodiments of the present disclosure can eliminate or simplify such processes.

Figure 8:
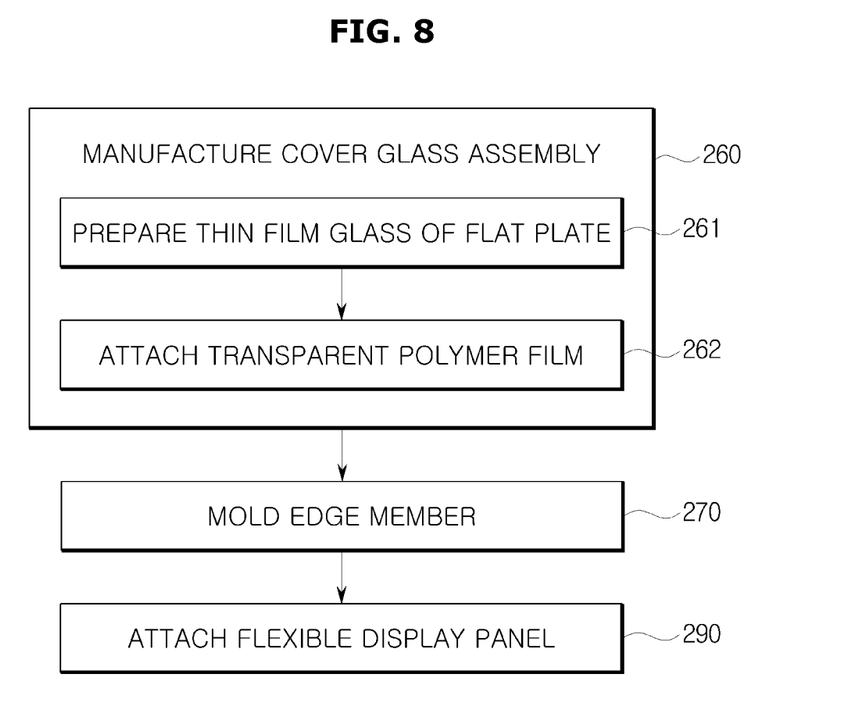
FIG. 8 illustrates processes of manufacturing a curved display device according to a second embodiment of the present disclosure.
Figure 9:
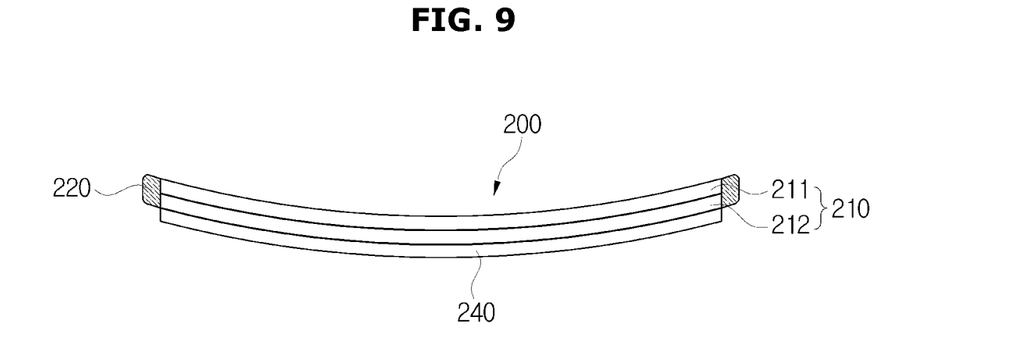
FIG. 9 is a cross-sectional view of the curved display device according to the second embodiment of the present disclosure.

FIG. 8 illustrates processes of manufacturing a curved display device according to a second embodiment, and FIG. 9 is a cross-sectional view of the curved display device according to the second embodiment.

Referring to FIGS. 8 and 9, the second embodiment is the case where a curved display device 200 is manufactured while excluding the light control film and the touch panel from the configuration of the first embodiment.

A method of manufacturing the curved display device 200 according to the second embodiment may include a process 260 of manufacturing a cover glass assembly 210 through a process 261 of preparing a thin film glass 211 of a flat plate and a process 262 of attaching a transparent polymer film 212 to the thin film glass 211 of a flat plate, a process 270 of molding an edge member 220 after inserting the cover glass assembly 210 in a bent state into a mold, and a process 290 of attaching a flexible display panel 240 to the back surface of the transparent polymer film 212 of the cover glass assembly 210 in a curved state after the edge member 220 is molded.

Figure 10:
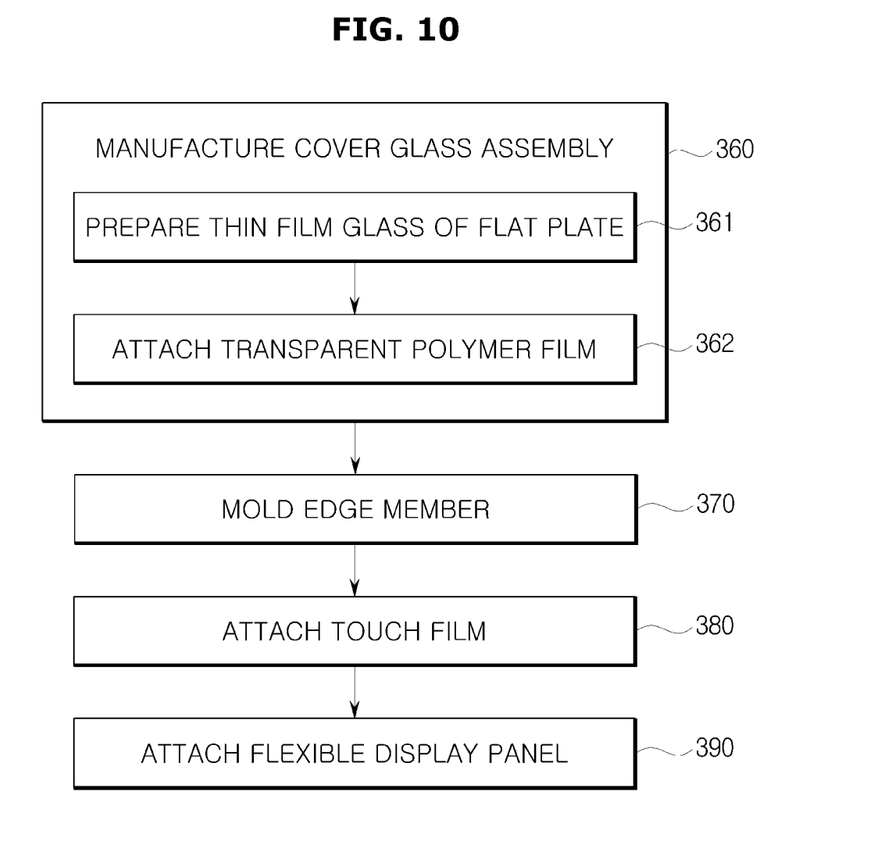
FIG. 10 illustrates processes of manufacturing a curved display device according to a third embodiment of the present disclosure.
Figure 11:
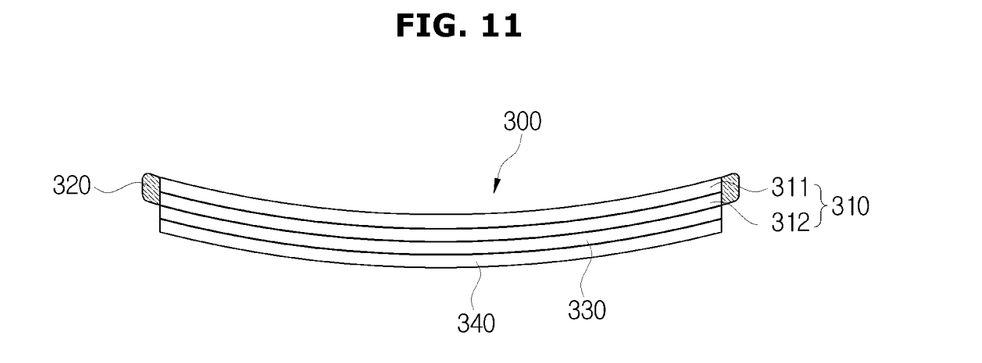
FIG. 11 is a cross-sectional view of the curved display device according to the third embodiment of the present disclosure.

FIG. 10 illustrates processes of manufacturing a curved display device according to a third embodiment, and FIG. 11 is a cross-sectional view of the curved display device according to the third embodiment.

Referring to FIGS. 10 and 11, the third embodiment is the case where a curved display device 300 is manufactured while excluding only the light control film from the configuration of the first embodiment.

A method of manufacturing the curved display device 300 according to the third embodiment may include a process 360 of manufacturing a cover glass assembly 310 through a process 361 of preparing a thin film glass 311 of a flat plate and a process 362 of attaching a transparent polymer film 312 to the thin film glass 311 of a flat plate, a process 370 of molding an edge member 320 after inserting the cover glass assembly 310 in a bent state into a mold, a process 380 of attaching a touch film 330 to the back surface of the transparent polymer film 312 of the cover glass assembly 310 in a curved state after the edge member 320 is molded, and a process 390 of attaching a flexible display panel 340 after the touch film 330 is attached.

The methods of manufacturing the curved display devices 200 and 300 according to the second and third embodiments can also further simplify the manufacturing process because the operation of attaching the transparent polymer films 212 and 312 to the thin film glasses 211 and 311 can be performed in a flat state and the cover glass assemblies 210 and 310 can be kept bent by inserting the cover glass assemblies 210 and 310 manufactured in a flat plate shape into the curved cavity of the mold in a bent state and then molding the edge members 220 and 320.

What is claimed is:

1. A curved display device comprising:
a cover glass assembly in which a transparent polymer film is laminated on the back surface of a thin film glass, the thin glass film composed of four edge surfaces, a front surface and a back surface and the transparent polymer film composed of four edge surfaces, a front surface and a back surface;
an edge member surrounding a periphery of the cover glass assembly, contacting the edge surfaces of the thin film glass and the edge surfaces of the transparent polymer film without overlapping the front and back surfaces of the thin film glass and the transparent polymer film, the edge member being integrated with the periphery of the cover glass assembly to maintain the cover glass assembly in a bent state by being molded so as to be integrated with an edge portion of the cover glass assembly; and
a flexible display panel attached to the back surface of the cover glass assembly that maintains a curvature.

2. The curved display device according to claim 1, wherein the cover glass assembly comprises a light control film attached to the back surface of the transparent polymer film.

3. The curved display device according to claim 2, wherein the transparent polymer film is a polycarbonate film.

4. The curved display device according to claim 1, further comprising a touch film laminated between the back surface of the cover glass assembly that maintains a curvature and the flexible display panel.

5. The curved display device according to claim 4, wherein the edge does not contact the touch film.

6. The curved display device according to claim 1, wherein the edge member contacts all of the edge surfaces of the thin film glass and the edge surfaces of the transparent polymer film.

7. The curved display device according to claim 2, wherein the transparent polymer film is an acrylic film.

8. The curved display device according to claim 2, wherein the transparent polymer film is a laminate of a polycarbonate film and an acrylic film.

9. The curved display device according to claim 1, wherein the edge member is integrated with the periphery of the cover glass assembly to maintain the cover glass assembly in a bent state by being molded so as to be integrated with an edge portion of the cover glass assembly in a state in which the cover glass assembly is bent and inserted into a curved cavity of a mold.

10. The curved display device according to claim 9, wherein a process of attaching the touch film to the back surface of the cover glass assembly before a process of attaching the flexible display panel.

11. The curved display device according to claim 1, wherein the curved display device is a windshield of a vehicle.

12. A method of manufacturing a curved display device, the method comprising:

manufacturing a cover glass assembly by attaching a transparent polymer film to the back surface of a thin film glass of a flat plate;

bending and inserting the cover glass assembly into a curved cavity of a mold and then molding an edge member molded integrally with a periphery of the cover glass assembly so as to surround the periphery of the cover glass assembly, contact the thin film glass and the transparent polymer film of the cover glass assembly, and be integrated with an edge portion of the cover glass assembly to maintain the cover glass assembly in a curved state;

after molding the edge member, attaching a touch film to the back surface of the cover glass assembly while the cover glass assembly is in the curved state; and attaching a flexible display panel to the back surface of the cover glass assembly in a curved state after attaching the touch film.

13. The method according to claim 12, wherein manufacturing the cover glass assembly comprises attaching a light control film to the back surface of the transparent polymer film.

14. The method according to claim 13, wherein manufacturing the curved display device comprises manufacturing a windshield of a vehicle.

15. The method according to claim 12, wherein the transparent polymer film is a polycarbonate film, an acrylic film, or a laminate of a polycarbonate film and an acrylic film.

16. A method of manufacturing a curved display device, the method comprising:

manufacturing a cover glass assembly by attaching a transparent polymer film to a back surface of a thin film glass of a flat plate;

bending and inserting the cover glass assembly into a curved cavity of a mold and, while the cover glass assembly is in the curved cavity of the mold, molding an edge member integrally with a periphery of the cover glass assembly so as to surround the periphery of the cover glass assembly, contact the thin film glass and the transparent polymer film of the cover glass assembly, and be integrated with an edge portion of the cover glass assembly to maintain the cover glass assembly in a curved state;

removing the cover glass assembly with the molded edge member from the curved cavity of the mold; and after removing the cover glass assembly, attaching a flexible display panel to the back surface of the cover glass assembly in a curved state after molding the edge member.

17. The method according to claim 16, further comprising attaching a touch film to the back surface of the cover glass assembly in a curved state before the process of attaching the flexible display panel.

18. The method according to claim 16, wherein manufacturing the cover glass assembly comprises attaching a light control film to the back surface of the transparent polymer film.

19. The method according to claim 18, wherein manufacturing the curved display device comprises manufacturing a windshield of a vehicle.

20. The method according to claim 16, wherein the transparent polymer film is a polycarbonate film, an acrylic film, or a laminate of a polycarbonate film and an acrylic film.

* * * * *